(12) United States Patent
Edelstein et al.

(10) Patent No.: US 6,441,614 B1
(45) Date of Patent: Aug. 27, 2002

(54) FILLER MATERIAL FOR MAGNET RESONANT SYSTEM SELF-SHIELDED GRADIENT COIL ASSEMBLIES

(75) Inventors: William Alan Edelstein, Schenectady; Robert Arvin Hedeen, Clifton Park, both of NY (US); Anthony Mantone, Brookfield, WI (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 09/453,082

(22) Filed: Dec. 2, 1999

(51) Int. Cl.⁷ .................................................. G01V 3/00
(52) U.S. Cl. ........................ 324/318; 324/320; 324/322; 324/307; 324/309
(58) Field of Search ................................ 324/318, 322, 324/320, 307, 309

(56) References Cited

U.S. PATENT DOCUMENTS

| | | | |
|---|---|---|---|
| 4,646,024 A | 2/1987 | Schenck et al. | 324/318 |
| 4,737,716 A | 4/1988 | Roemer et al. | 324/319 |
| 4,978,920 A | * 12/1990 | Mansfield et al. | 324/318 |
| 5,570,021 A | 10/1996 | Dachniwskyj et al. | 324/318 |

* cited by examiner

Primary Examiner—Edward Lefkowitz
Assistant Examiner—Dixomara Vargas
(74) Attorney, Agent, or Firm—Jean K. Testa; Donald S. Ingraham

(57) ABSTRACT

A self-shielded gradient coil assembly for an MR imaging system has inner and outer gradient coil windings disposed in coaxial relationship and defining a hollow annular space therebetween. Inner and outer helical cooling tubes are affixed to the outer and inner surfaces of the inner and outer gradient coil windings, respectively, by a thermally conductive epoxy, and a concrete filler material substantially fills the remaining hollow annular space. The concrete filler material may be poured into the hollow annular space to fill the space, or a pre-formed hollow concrete cylinder may be inserted coaxially into the space, defining remaining inner and outer annular volumes which are then filled with a thermally conductive epoxy bonding together the inner and outer gradient coil windings, the cooling tubes and the hollow concrete cylinder.

6 Claims, 6 Drawing Sheets

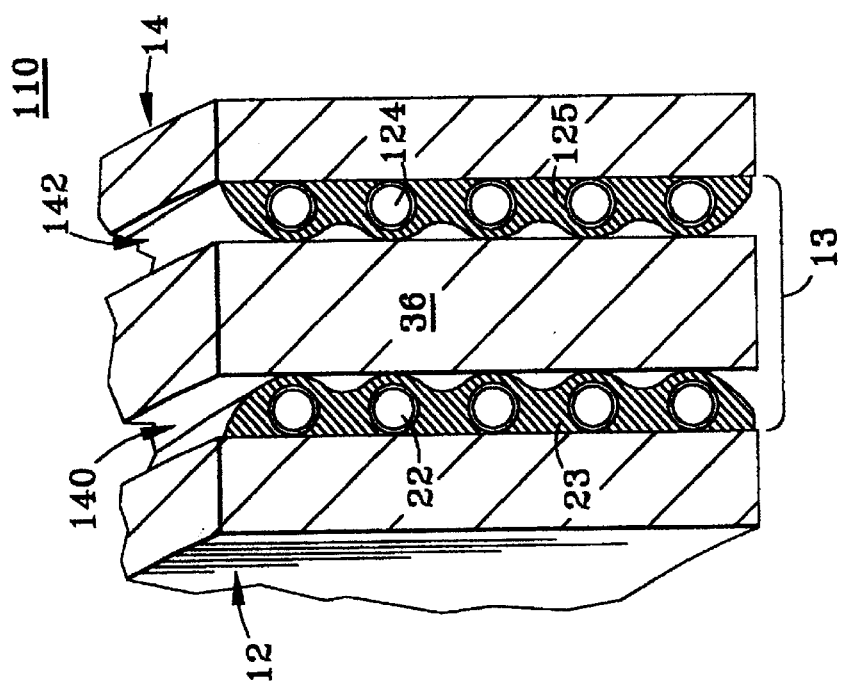
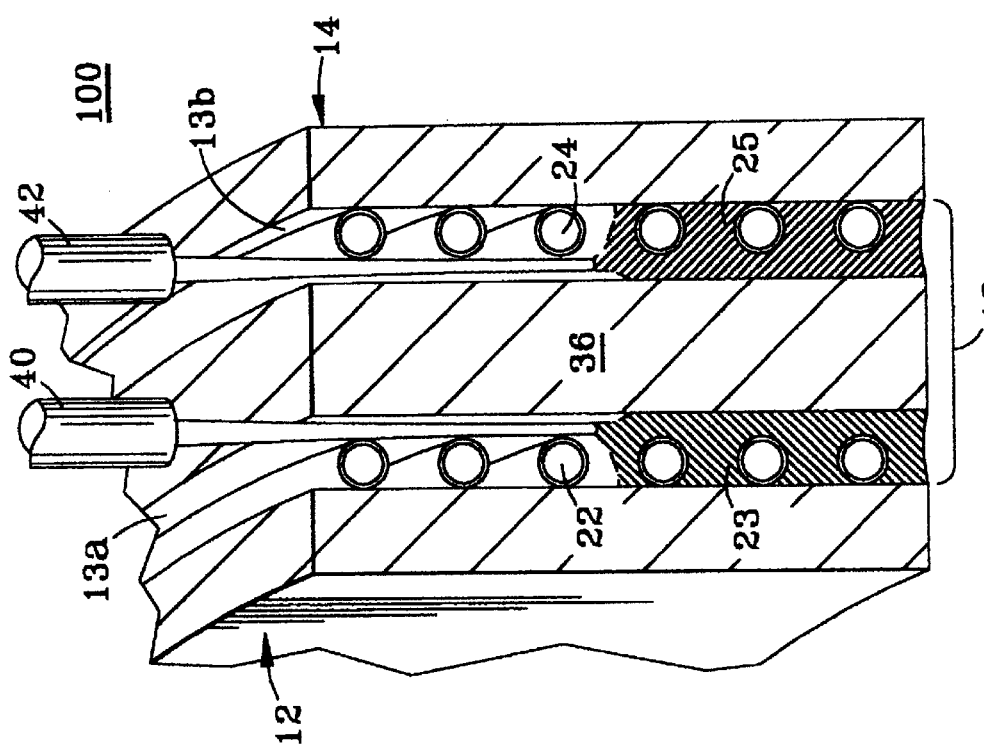

US 6,441,614 B1

FILLER MATERIAL FOR MAGNET RESONANT SYSTEM SELF-SHIELDED GRADIENT COIL ASSEMBLIES

BACKGROUND OF THE INVENTION

This invention relates to an improved self-shielded gradient coil assembly for a conventional magnetic resonant (MR) system wherein inner and outer gradient coil windings are wound on inner and outer concentric fiber-reinforced plastic (FRP) cylinders with an annular space therebetween filled with a filler material and, more particularly, to a concrete filler material comprising cement and a selected aggregate material.

It is well known in MR imaging to employ a self-shielded gradient coil assembly (also known as a self-shielded gradient coil set) to generate the required gradient magnetic fields, i.e., the X-, Y-, and Z-gradient fields, where X, Y and Z represent the respective axes of a three-dimensional Cartesian coordinate system. Generally, a self-shielded gradient coil assembly has inner and outer gradient coil windings wrapped around respective, inner and outer cylindrical coil forms disposed in spaced-apart coaxial relationship within the bore of an associated MR main magnet. Each of the coil windings is actuated or energized by a corresponding current to produce a magnetic field, the inner and outer coil-windings being designed in relation to each other so that their fields combine within the bore of the magnet to produce a resultant magnetic field comprising respective ones of the X-, Y- and Z-gradient fields. The fields of the two coils substantially cancel each other outside of the outer coil form, so as not to modify or alter the main magnetic field. A gradient coil set, or assembly, is described, for example, in commonly assigned U.S. Pat. No. 4,737,716, issued Apr. 12, 1988 to Roemer et. al., and for which re-examination certificate B1, U.S. Pat. No. 4,737,716 was issued.

It is currently common practice in MR imaging to place the inner coils for X-, Y-and Z-gradient coil sets on a single inner coil form, and to place the corresponding outer X-, Y- and Z-coils on a single outer coil form which is in coaxial relationship with the inner coil form. Thus, the inner and outer coils, or coil windings, of each coil set, or assembly, are in radially spaced apart, coaxial relationship with each other. In a typical such arrangement, each coil of the Z-gradient coil set comprises a wire helically wound around one of the coil forms. Each coil of the X-gradient coil set comprises a "fingerprint coil" or the like, which is etched or otherwise formed on a sheet or board of copper, each such sheet being wrapped around a coil form over the Z-gradient windings. The Y-gradient coils likewise comprise fingerprint coils formed on copper sheets, one such sheet being wrapped around each coil form over the sheet containing the X-gradient windings, but in orthogonal relationship therewith. See, for example, U.S. Pat. No. 4,646,024—Schenck et al., issued Feb. 27, 1987 and assigned to the common assignee herewith.

When current pulses are applied to the gradient coil windings contained within the static field of the MR main magnet, mechanical forces are created that tend to displace the coils relative to their respective coil forms. Accurate positioning of the coils relative to their forms is critical for proper generation of gradient fields; therefore, such mechanical forces must be opposed to prevent displacement of the coils relative to each other and to the respective forms thereof and, moreover, to maintain the integrity of the structural relationship thereby to suppress mechanical vibrations which could damage the coils and also generate a much higher level of noise in the surrounding environment.

The high current levels employed in conventional gradient coils produce significant heat proximate to the coils. The heat must be conducted away from the coils and the magnet bore region to prevent damage to the coils and related structure, to avoid unwanted changes in the main magnetic field due to heating of magnet components, and to prevent unacceptable heating of a patient or other subject in the bore.

Commonly assigned U.S. Pat. No. 5,570,021 issued Oct. 29, 1996 to Dachniwskyj et al. discloses a gradient coil support assembly for an MR imaging system which addresses the above problems resulting from energization of the gradient coil windings. The assembly includes a first cylindrical coil form disposed to support a first gradient coil of a gradient coil set, and a second cylindrical coil form disposed to support a second gradient coil of the set, the second coil form being positioned in coaxial spaced-apart relationship with the first coil form and forming an annular, cylindrical space therebetween. A stiffening cylinder is positioned in the space between the first and second coil forms to divide the annular space between the first and second coil forms into a first volume located between the stiffening cylinder and the first coil form, and a second volume located between the stiffening cylinder and the second coil form. Adhesive material, such as an epoxy, is introduced into the first and second volumes to bond both the first and second coil forms to the stiffening cylinder and thereby hold the first and second gradient coils in rigid, fixed relationship with respect to each other. With the second coil form having a larger diameter than the first coil form, a first flexible cooling tube is helically positioned around the first coil form and located in the first volume, and a second flexible cooling tube is helically positioned around the stiffening cylinder and located in the second volume. A circulating unit directs coolant through the cooling tubes to remove heat from regions proximate to the gradient coils. A layer of filament, such as a fiberglass element, may be wrapped around each coil form and the gradient coil winding thereon to provide additional support for tightly holding each coil winding on its respective coil form. The stiffening cylinder thickness may be selected in relation to the spacing between the first and second coil forms to provide respective dimensions for the first and second volumes selected to optimize curing of the epoxy therein. The dimensions are intended to provide a specified minimum curing time. Also, the epoxy in each volume is caused to cure or harden uniformly, i.e., the epoxy at each point in the volume hardens at very nearly the same time.

While reasonably effective in providing the bonding functions, epoxy does not afford adequate suppression of vibration and noise. Decreasing vibrations is important, particularly as current levels in the gradient coils increase, to afford a reduction in the accompanying acoustic noise during operation of the MR systems.

BRIEF SUMMARY OF THE INVENTION

An improved filler material for a self-shielded gradient coil assembly of an MR system makes the assembly stiffer and/or more highly damped, thereby more effectively suppressing current-pulse-generated vibrations and consequent acoustic noise, while an attaching and supporting structure for such gradient coil assembly is capable of suppressing vibrations and opposing coil displacement resulting from strong mechanical forces applied to the coils as a result of high currents in the coils while the gradient coil assembly is situated in a static magnetic field.

The attaching and supporting structure of the invention reduces the sizes of the respective annular volumes, or spaces, into which epoxy is introduced, enhancing curing uniformity and significantly reducing curing time for the epoxy. The attaching and supporting structure also allows for the assemblage therein of water cooling tubes which greatly reduce undesirable heating resulting from operation of the coils at high current levels and also significantly reduce noise produced in the gradient coil assembly when operated at high current levels.

More particularly, a concrete material, preferably a conglomerate of Portland cement and one or more selected aggregates, affords more effective suppression of vibration and noise, relative to the suppression thereof afforded by a conventional epoxy filler, and at low cost. The concrete may be introduced directly into the annular cylindrical space between inner and outer cylindrical, concentric FRP cylinders having respective helices of cooling tubes affixed on their respectively opposing, outer and inner surfaces. Alternatively, a concrete cylinder with a hollow annulus, i.e., a cylindrical concrete sleeve, of appropriate inner and outer diameters and with radial thickness less than that of the annulus formed between the concentrically-positioned inner and outer FRP cylinders may be inserted coaxially into the annulus, thereby defining inner and outer annular volumes, or spaces, in which respective water cooling tubes are supported. These annular volumes are then filled with a conventional thermal epoxy. Testing has shown that a significant reduction in noise levels is achieved through use of a concrete filler material relative to that afforded by conventional epoxy filler materials.

BRIEF DESCRIPTION OF THE DRAWINGS

FIG. 7 is a fragmentary cross sectional view, as in FIG. 3, of the second embodiment of the invention at an initial stage of its assemblage.

FIG. 8 is a fragmentary cross sectional view, as in FIG. 3, of a third embodiment of the invention at an initial stage of its assemblage.

DETAILED DESCRIPTION OF THE INVENTION

Figure 1:
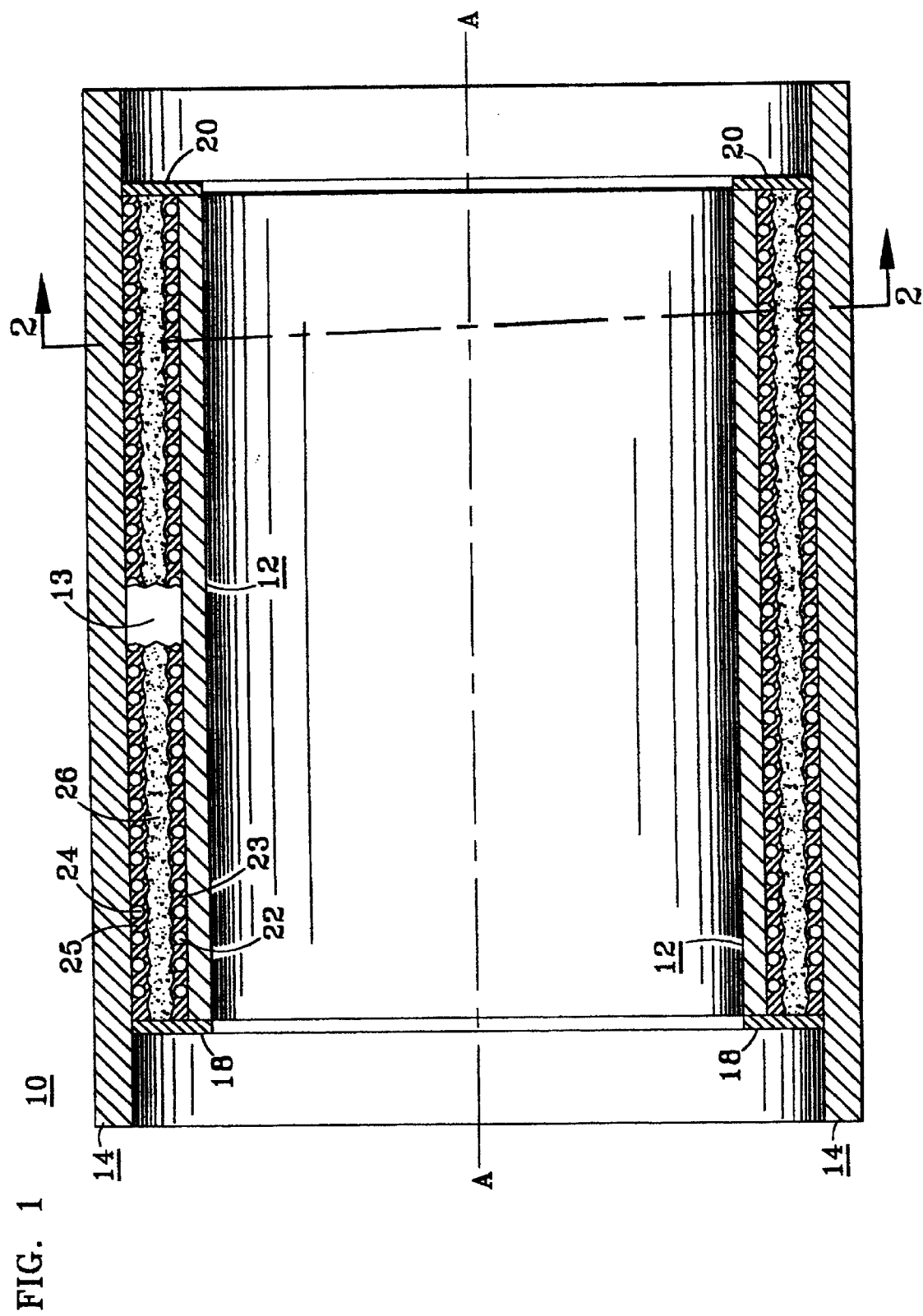
FIG. 1 is a sectional view, taken in a plane through a central longitudinal axis, of an MR gradient coil set assembly in accordance with a first embodiment of the invention.
Figure 2:
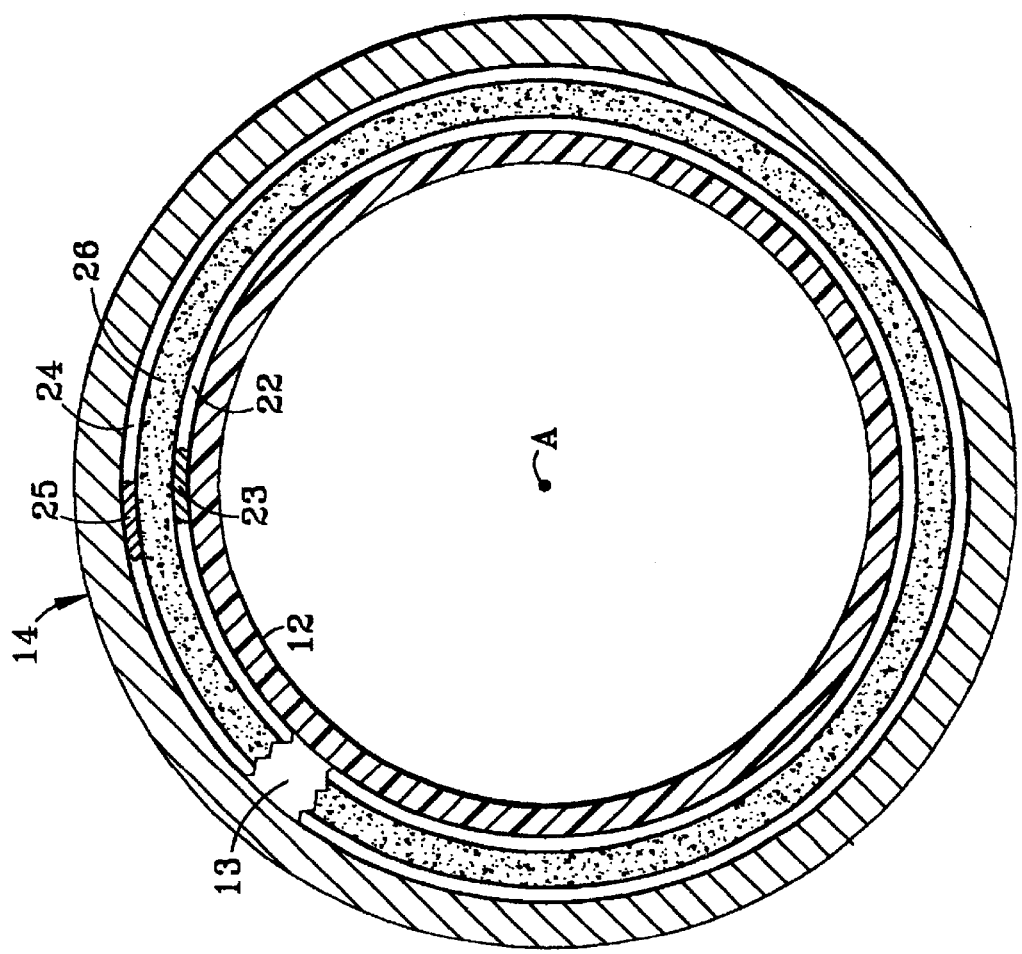
FIG. 2 is a simplified cross-sectional view taken along line 2—2 of FIG. 1.

FIGS. 1 and 2 shows a self-shielded gradient coil assembly 10 for an MR imaging system (not shown), comprising cylindrical inner and outer gradient coil windings 12 and 14, respectively, disposed in concentric arrangement with respect to a common axis A. A continuous cooling tube 22 is wound in a helix about the outer diameter (O.D.) surface of inner gradient coil winding 12 and a corresponding continuous cooling tube 24 is formed in a helix on the inner diameter (I.D.) surface of outer gradient coil winding 14, tubes 22 and 24 being respectively held in place by layers of epoxy 23 and 25. Inner gradient coil winding 12 includes inner coils of X-, Y- and Z-gradient coil pairs, or sets, and outer gradient coil winding 14 includes the respective outer coils of the X-, Y- and Z-gradient coil pairs, or sets. Inner and outer gradient coil windings 12 and 14 are held in radially spaced-apart coaxial relationship, relative to each other, by annular end rings 18 and 20 which may be fixed to inner gradient coil winding 12 by screws (not shown) extending in a direction parallel to axis A—A, through rings 18 and 20 and into threaded engagement with the sidewall of inner gradient coil winding 12. Further, suitable brackets (not shown) and fastening devices, such as screws (not shown), may interconnect each of rings 18 and 20 to the interior sidewall of outer gradient coil winding 14, to maintain a fixed axial relationship between inner and outer gradient coil windings 12 and 14.

In an alternative, commonly used configuration, the outer gradient coil winding is of the same axial length as the inner such winding 12 and annular end rings 18 and 20 are of an increased outer diameter, at least equal to that of outer gradient coil winding 14, and may be secured thereto in the same manner as described for securing the end rings to inner gradient coil winding 12.

The epoxy used for layers 23 and 25 contains alumina particulate material to increase its thermal conductivity. This enhances effectiveness of the epoxy in conducting heat, generated by the respective gradient coils, away from inner and outer gradient coil windings 12 and 14 and to cooling tubes 22 and 24. Since epoxy layers 23 and 25 are air cured in accordance with a preferred fabrication process for self-shielded gradient coil assembly 10, as previously discussed, layers 23 and 25 have great mechanical strength to resist forces generated when electric currents are conducted by the gradient coils.

Preferably, cooling tubes 22 and 24 are affixed by respective epoxy layers 23 and 25 to the opposing surfaces of inner and outer gradient coil windings 12 and 14, as individual, separated units, and the epoxy material is then allowed to cure. Inner and outer gradient coil windings 12 and 14 with respective cooling tubes 22 and 24 affixed thereto by cured epoxy layers 23 and 25, respectively, are then assembled into the coaxial relationship shown. The assembly may be done either with the common axis A—A horizontal, as suggested by FIG. 1, or vertical, or some intermediate angle therebetween, as desired. Annular end rings 18 and 20 are then affixed to the corresponding, opposite ends of inner and outer gradient coil winding 12 and to the interior surface of outer gradient coil winding 14, to maintain the concentric relationship thereof illustrated in FIGS. 1 and 2. One of end rings 18 and 20 furthermore has openings therein (not shown) providing access to a cylindrical space 13 between opposing surfaces of inner and outer gradient coil windings 12 and 14 and respective epoxy layers 23 and 25 covering the respective cooling tubes 22 and 24.

Figure 3:
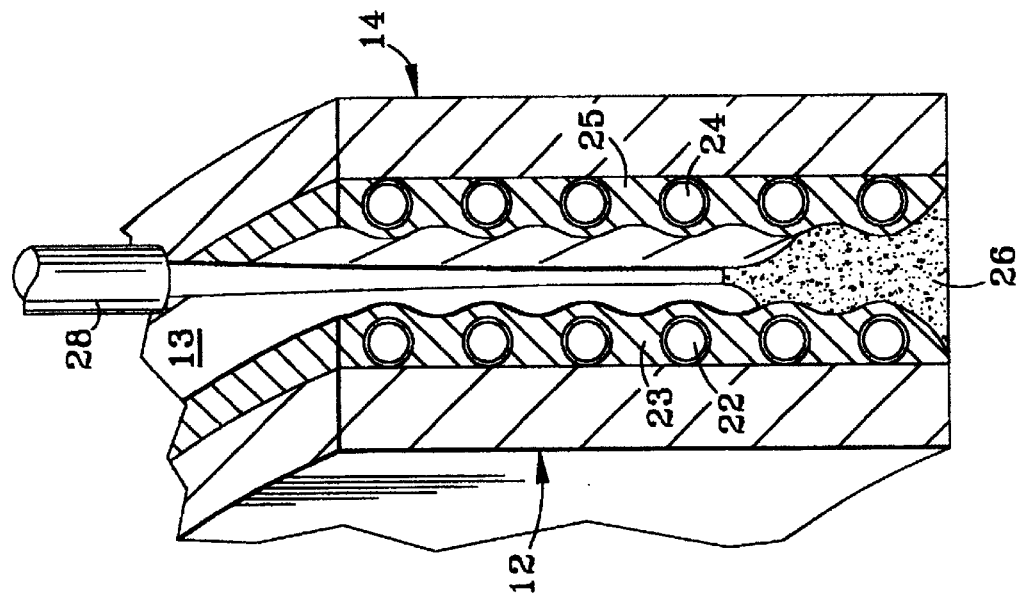
FIG. 3 is a fragmentary, cross-sectional view of the gradient coil set of FIGS. 1 and 2, illustrating a first embodiment of a fabrication method, and details of the resulting structure of the first embodiment of the invention.

If self-shielded gradient coil assembly 10 is in a horizontal (or other non-vertical) orientation, it is then rotated to a vertical orientation of axis A—A with the solid end ring at the bottom and the end ring with openings therein at the top. As shown in FIG. 3, concrete 26 is then poured into cylindrical space 13 from a nozzle 28, filling the space completely. After the concrete has cured, end rings 18 and 20 typically are removed.

Figure 4:
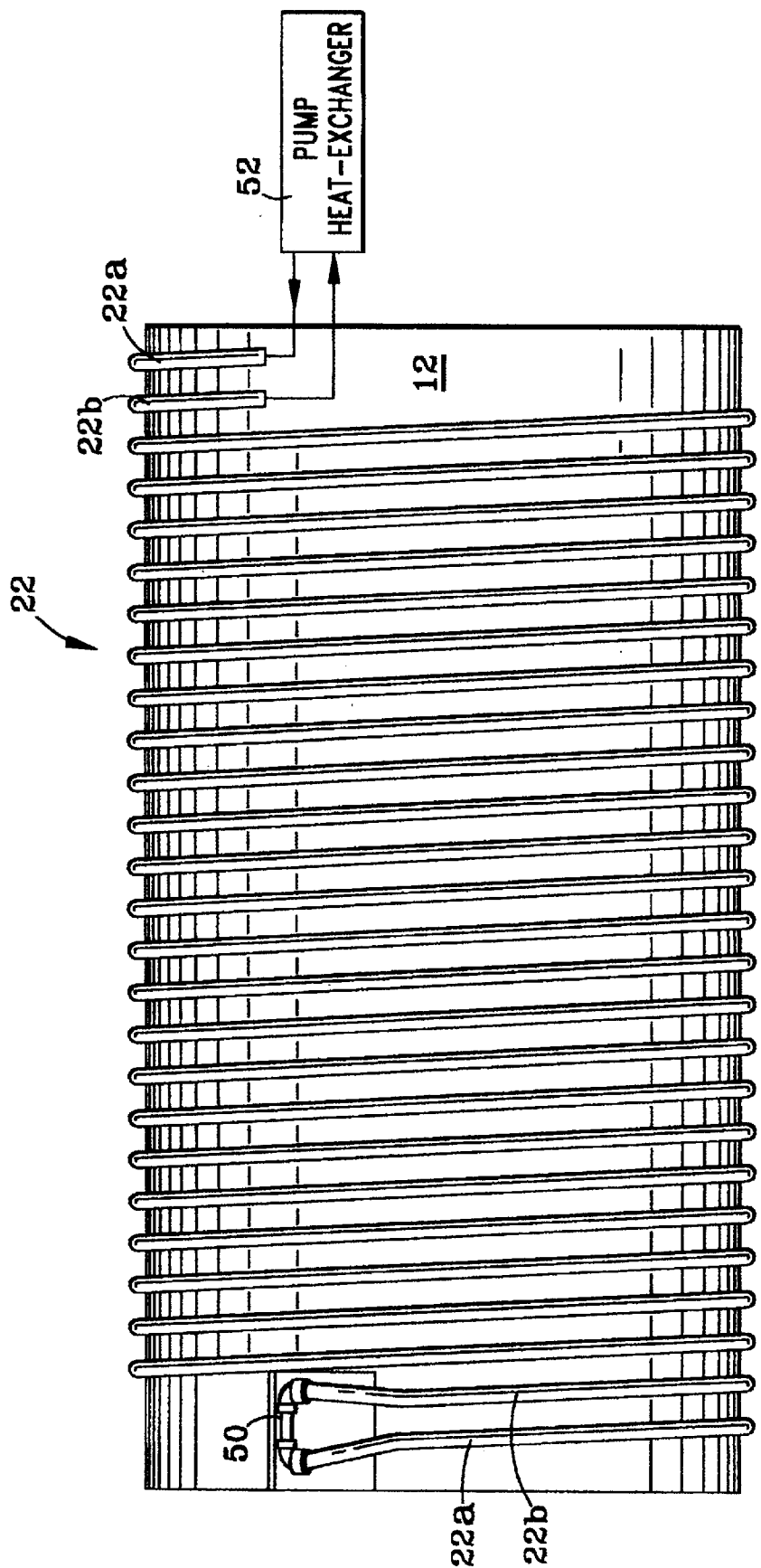
FIG. 4 is a side elevational view of an inner gradient coil winding and an associated pump-heat exchanger for the embodiment of FIG. 1.

FIG. 4 shows cooling tube 22 which is wrapped in a helix around inner gradient coil winding 12 and may comprise a single continuous length or, preferably, two separate lengths of tubing 22a and 22b. One end of each of tubing 22a and 23a is joined to a coupling 50 attached to inner gradient coil winding 12 at the leftward end thereof, as viewed in FIG. 4. Coupling 50 provides a passage to direct flow of coolant fluid from one of the lengths of tubing 22a and 22b, into the other, rendering them effectively continuous. Tubing lengths 22a and 22b are wrapped around inner gradient coil winding 12 in an alternating helical manner and the ends thereof, located at the rightward end of inner gradient coil winding 12 as viewed in FIG. 4, are coupled to a pump heat-exchanger 52. More particularly, heat-exchanger 52 directs coolant fluid, such as water, into tubing length 22a for circulation around inner gradient coil winding 12 to conduct heat away therefrom. The fluid returns through tubing 22b to pump heat-exchanger 52, which operates to remove heat therefrom. While not shown in FIG. 4, tubing 24 associated with outer gradient coil winding 14 is configured in generally the same manner and is likewise coupled to pump heat-exchanger 52.

In accordance with conventional practice, self-shielded gradient coil assembly 10 shown in FIGS. 1 and 2 is inserted into the bore of a main magnet (not shown) of an MRI system so that axis A (FIG. 1) aligns with the bore axis of the main magnet (not shown). The coils of self-shielded gradient coil assembly 10 are then activated by passing an electric current therethrough, to generate a gradient field in the bore, as required for MR imaging.

Figure 5:
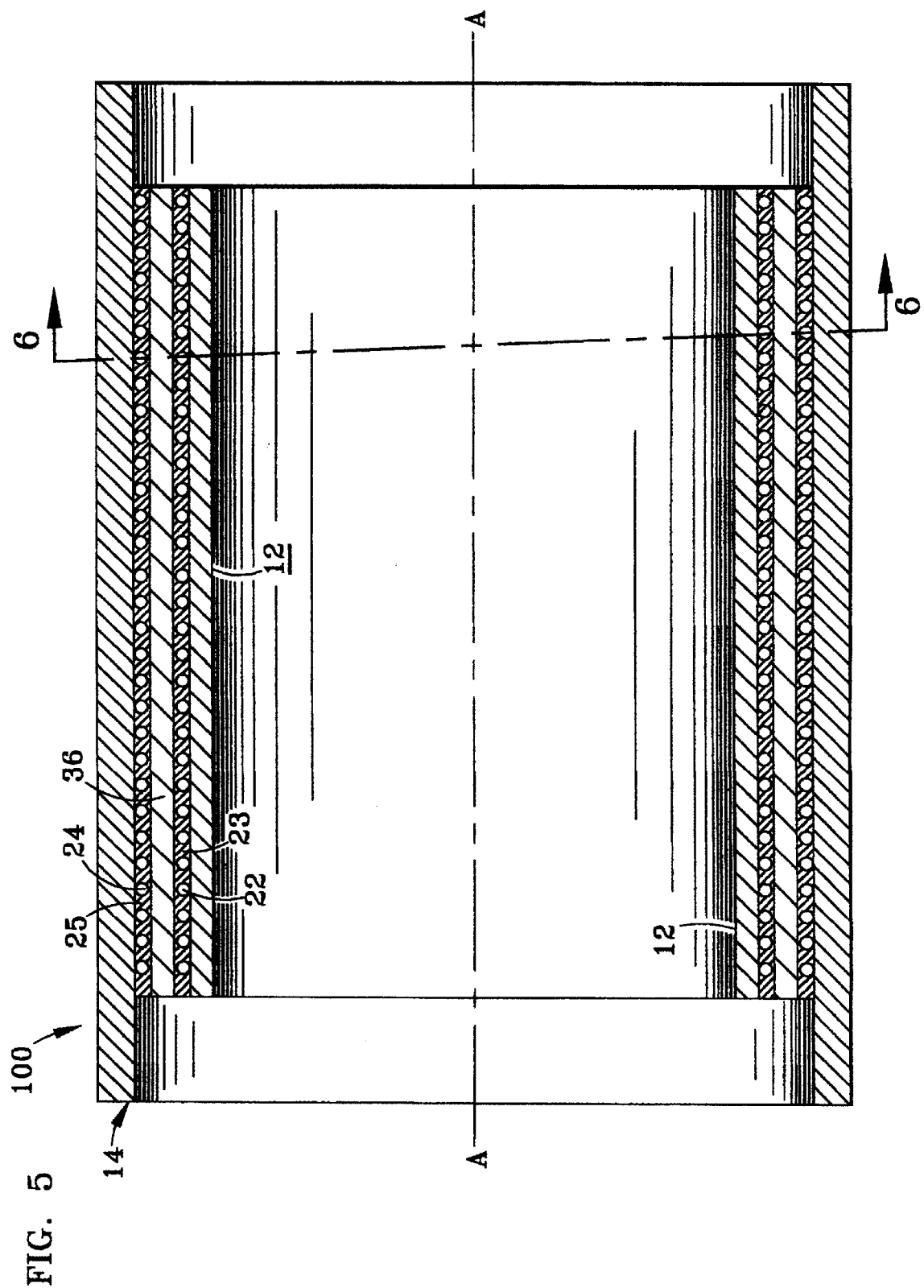
FIG. 5 is a sectional view, taken in a plane through a central longitudinal axis, of an MR gradient coil set assembly in accordance with a second embodiment of the invention.
Figure 6:
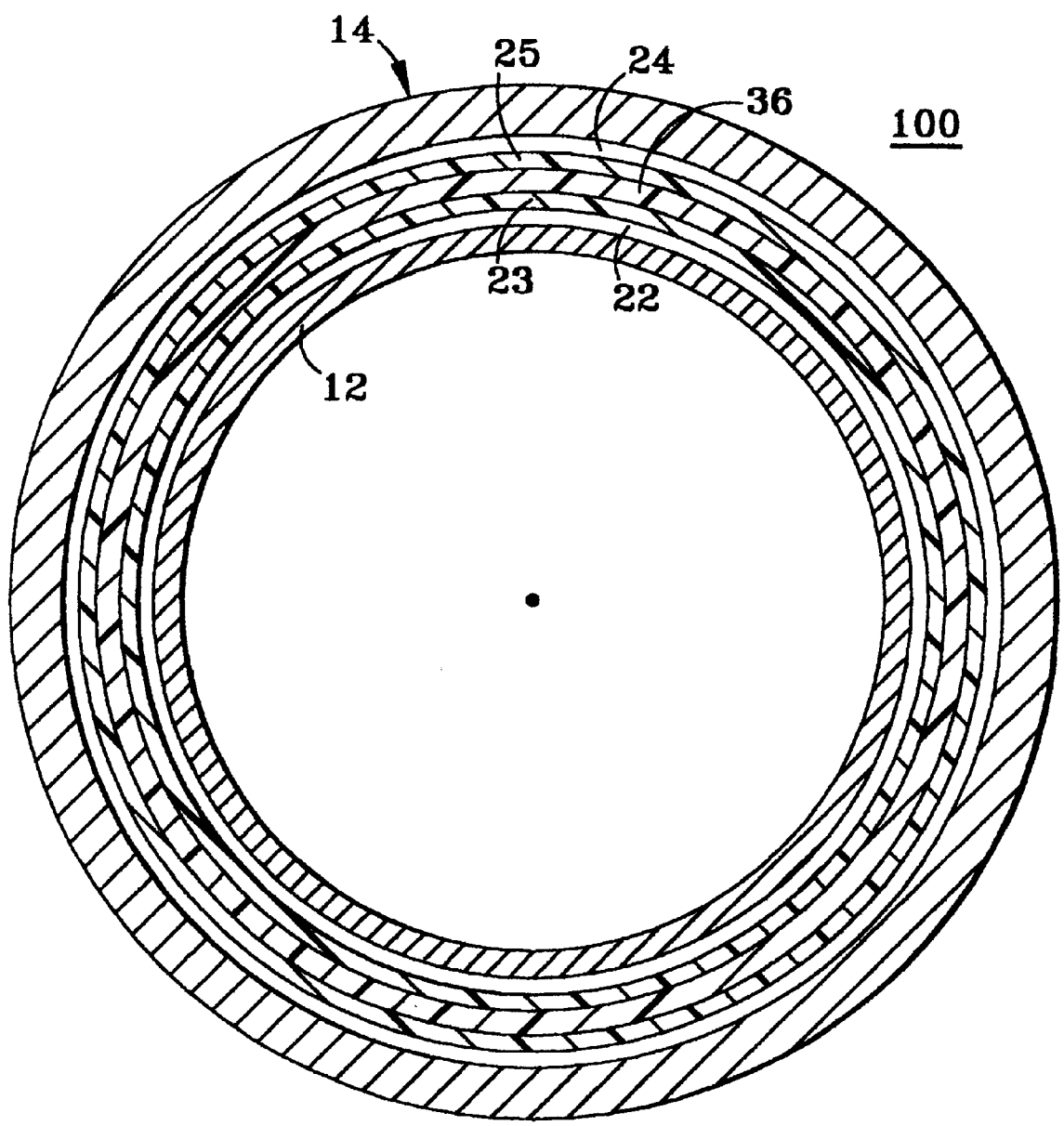
FIG. 6 is a cross sectional view, taken along line 6—6 of FIG. 5.

FIG. 5 shows a self-shielded gradient coil assembly 100 in accordance with a second embodiment of the invention, taken in a longitudinal cross sectional view in a plane including the axis A, while FIG. 6 is an elevational, cross sectional view thereof in a plane perpendicular to axis A, along line 6—6 in FIG. 5. Inner and outer gradient coil windings 12 and 14 and helical cooling tubes 22 and 24, wound onto the respective outer and inner cylindrical surfaces thereof and fixed thereon by respective layers of epoxy 23 and 25, may be identical to those of the first embodiment. Inner and outer gradient coil windings 12 and 14 are then assembled into a concentric, coaxial relationship, again defining a cylindrical space 13 between the opposing surfaces of epoxy layers 23 and 25. A concrete cylinder 36, of a hollow cylindrical, or annular, construction and of appropriate inner and outer diameters, is disposed coaxially into cylindrical space 13, defining inner and outer annular spaces, or volumes, 13a and 13b between the inner and outer cylindrical surfaces of concrete cylinder 36 and the respective, opposed surfaces of epoxy layers 23 and 25. Further epoxy material is added so as to expand the radial thickness of each of layers 23 and 25 and thereby fill annular spaces 13a and 13b between the initial epoxy layers 23 and 25 and the respective, inner and outer opposed cylindrical surfaces of concrete cylinder 36. Thus the epoxy material adjoins concrete cylinder 36 and each of the inner and outer gradient coil windings 12 and 14, respectively.

A process for producing the self-shielded gradient coil assembly 100 will be better appreciated from FIG. 7, a fragmentary and cross-sectional view of gradient coil assembly 100 of FIGS. 5 and 6. In FIG. 7, helical cooling tubes 22 and 24 are affixed on the outer and inner cylindrical surfaces of inner and outer gradient coil windings 12 and 14, respectively, by respective layers of epoxy 23 and 25. Inner and outer gradient coil windings 12 and 14 may be held in coaxial relationship and concrete cylinder 36 slid therebetween or, if preferred, concrete cylinder 36 may be coaxially slid over inner gradient coil winding 12 with cooling tubes 22 and epoxy layer 23 thereon, and outer gradient coil winding 14, with cooling tube 24 and epoxy layer 25 thereon, may then be coaxially slid over concrete cylinder 36. Correspondingly, there will remain cylindrical gaps, or volumes, 13a and 13b between the inner and outer surfaces of concrete cylinder 36 and opposed epoxy layers 23 and 25.

Nozzles 40 and 42 then direct streams 23a and 25a of additional epoxy material into annular spaces 13a and 13b, to fill those spaces.

A self-shielded gradient coil assembly 110 in accordance with a third embodiment of the invention is shown in FIG. 8. Here, a helical cooling tube 22 is formed on the outer cylindrical surface of inner gradient coil winding 12 and a helical cooling tube 124, otherwise corresponding to a helical cooling tube 24 in the first two embodiments, is formed on the outer cylindrical surface of concrete cylinder 36. Cooling tubes 22 and 124 may be held in place by respective layers of epoxy 23 and 125. There are thus produced inner and outer annular volumes, or spaces, 140 and 142, each of which may be filled with epoxy, as disclosed in FIG. 7, thereby both securing cooling tubes 22 and 124 to the corresponding surfaces that they engage and filling spaces 140 and 142, including the gaps between the helices of the cooling tubes.

To facilitate the mounting of cooling tubes 22 and 24 of the first and second embodiments and with reference to FIGS. 3 and 7, for example, helical cooling tube 22 may be wound to have an inner diameter slightly less than the outer cylindrical surface of inner gradient coil winding 12 and outer helical cooling tube 24 may be wound to have an outer diameter slightly greater than the inner diameter of outer gradient coil winding 14. Helical tube 24 may be conveniently formed by winding the tube on the outer cylinder of outer gradient coil winding 14. Cooling tube 22 is then twisted to increase its diameter, slid onto the outer cylindrical surface of gradient coil winding 12, and then released. The natural springiness, or resilience, of the copper material of cooling tube 22 will cause the cooling tube to contract toward its original diameter, causing the cooling tube to tightly bind, frictionally, on the outer cylindrical surface of inner gradient coil winding 12. In much the same way, cooling tube 124 may be twisted to decrease its O.D., inserted into outer gradient coil winding 14, and then released, whereupon the natural springiness of coil 124 will cause it to expand toward its original wound O.D. and tightly, frictionally engage the inner cylindrical surface of outer gradient coil winding 14. For the third embodiment of FIG. 8, the same technique as used for mounting cooling tube 22 in the second embodiment (FIG. 7) may be employed to mount both cooling tubes 22 and 124 on the respective outer surface of inner gradient coil winding 12 and the outer cylindrical surface of concrete cylinder 36, followed by applying epoxy layers 23 and 125.

For convenience of illustration, inner and outer gradient coil windings 12 and 14 are shown in the figures in an orientation with aligned central longitudinal axes generally in a horizontal plane; however, inner and outer gradient coil cylinders in each embodiment may be positioned concentrically with their axes vertically disposed, either for filling the annular space therebetween with concrete, as in the first embodiment, or for coaxially lowering a hollow concrete cylinder into the annular space between the inner and outer coil assemblies with subsequent filling of the resulting inner and outer volumes with epoxy, as in the second and third embodiments. Alternatively, the gradient coil may be assembled horizontally by holding the inner gradient cylinder in a horizontal position on a stand and then sliding the concrete cylinder coaxially and concentrically thereover, followed by sliding the outer gradient cylinder concentrically over the concrete cylinder. The three cylinders then are mechanically fastened together and rotated to a vertical orientation for the subsequent filling steps.

While it is believed that maximizing the amount of concrete is desirable for achieving reduced vibration and other benefits, as noted above, the use of thermally-conductive epoxy is beneficial by ensuring good thermal contact between the water cooling tubes and the inner and outer gradient windings. Hence, the selection of the particular embodiment of the invention to be employed in a given application will depend upon the requirements of the given application.

When epoxy is inserted into the respective spaces, or volumes, between inner gradient coil winding 12 and concrete cylinder 36, and between cylinder 36 and outer gradient coil winding 14 to form respective epoxy layers 23 and 25 (in FIGS. 1–7) and 23 and 125 (in FIG. 8), the epoxy tends to be channeled by, i.e., flow along, helically wound tubes 22 and 24 (in FIGS. 1–7) and 23 and 125 (in FIG. 8). This channeling substantially reduces lathering, i.e., the formation of clusters of small bubbles in the resulting epoxy layers. This, in turn, has the effect of strengthening the epoxy layers, and reducing the possibility of their cracking. Moreover, reducing bubbles maintains the thermal conductivity of the epoxy. In this fashion, the helically wrapped cooling tubes provide an additional benefit.

The concrete filler can be made in many sizes and forms, and also of many different compositions, to optimize its properties as a filler for the present purpose. Generally, concrete (i.e., "conventional" or "standard" concrete) consists of portland cement and an aggregate. The aggregate may comprise a selected one, or combination, of materials having lower density than portland cement, such as expanded shale, fly ash and pumice that reduce the weight, but have minimal adverse impact on the strength and stiffness of the concrete, compared to normal (i.e., higher density) concrete. Also, foam can be introduced into the concrete to make it lighter in weight. Fibers, such as glass, fiberglass, carbon fiber and plastic fibers, can be included to increase tensile strength, which is important since concrete cylinders 36 employed in the second and third embodiments of the invention have relatively thin annular walls compared, for example, to the annular wall thickness of poured concrete cylinder 26 in the first embodiment of FIGS. 1–4. Other treatments of the concrete, such as subjecting the concrete to supercritical $CO_2$ while hardening, are also considered to be useful for increasing the strength of the concrete incorporated into the gradient assembly. One preferred embodiment, with beneficial results, was obtained using concrete made of cement with pumice aggregate and a water-latex solution.

Test Results

A number of test cylinders of FRP were prepared, each comprising a hollow annulus and in roughly the same structural proportions as an actual gradient assembly, but about one-third (⅓rd) scale of conventional gradient coil assemblies. The test cylinders contained a simplified Z-gradient coil attached to the O.D. of the inner gradient coil winding, corresponding to inner gradient coil winding 12 in the above figures. The annulus (13 in the above figures) between the inner and outer gradient coil windings cylinders (e.g., 12 and 14 in the above figures) in each of the test cylinders was filled with a respective, selected one of a variety of materials and allowed to cure, per the manufacturer's instructions. Each test cylinder was then inserted in axial alignment with, and into, an ordinary MRI magnet assembly commercially produced and available from General Electric Company, Milwaukee, WI. The magnet was then pulsed with current having a periodic trapezoidal waveform and an amplitude of about 20 amperes. Accelerometers were used to measure the resulting vibrations respectively of the inner and outer cylinders.

The results of the testing are set forth in the following Table 1.

TABLE 1

Relative Vibration Levels for Test Cylinders ("TC") using Various Mini-Gradient Potting Materials

| Materials | Specific Gravity | Relative Vibration Inner (dB) | Relative Vibration Outer (CIB) |
|---|---|---|---|
| TC1: Hollow FRP coils | — | +11.8 | +4.48 |
| TC2: Standard Epoxy | 2.08 | 0.0 | 0.0 |
| TC3: Sand | 1.65 | +7.7 | −9.6 |
| TC4: Standard concrete | 2.27 | −9.1 | −8.3 |
| TC5: Lightweight concrete (pumice aggregate) | 1.68 | −10.8 | −9.9 |
| TC6: Lightweight concrete (pumice + latex) | 1.82 | −16.8 | −12.7 |

In Table 1, TC1 through TC6 designate respective test cylinders having fillers of the specified materials and for which the indicated specific gravity and relative vibration test results were measured. These tests were performed using cylinders with no cooling tubes and only one gradient winding (on the inner cylinder). The concrete was poured directly into the annulus, generally in accordance with the first embodiment. TC2 is the standard epoxy material conventionally used and the relative inner and outer vibration measurements of TC2 were taken as 0.0 dB, in each instance, to afford a standard of reference for comparison with the other test cylinders TC1 and TC3–TC6.

From Table 1, it is seen that test cylinder TC4 of standard concrete, while of higher specific gravity than standard epoxy, provided substantial reductions in decibel levels for both inner and outer vibrations relative to the standard epoxy test cylinder TC2. Moreover, the test cylinders TC5 and TC6, of the specified lightweight concretes, had lower specific gravity values than that of the standard epoxy test cylinder TC2 and reduced inner and outer relative vibration dB levels even more than TC4. It is reasonable to conclude from the test data that airborne noise from a full size BRM will drop approximately 10 dB relative to a conventional epoxy-filled gradient cylinder if at least some substantial portion of the epoxy filler of the conventional gradient cylinder is replaced with concrete, in accordance with each of the various embodiments of the invention disclosed herein.

While only certain preferred features of the invention have been illustrated and described, many modifications and changes will occur to those skilled in the art. It is, therefore, to be understood that the appended claims are intended to cover all such modifications and changes as fall within the true spirit of the invention.

What is claimed is:

1. A self-shielded gradient coil assembly, comprising:
   inner and outer gradient coil windings, each of a hollow cylindrical configuration and of respectively smaller and larger inner and outer diameters, disposed in coaxial relationship and defining a hollow annular space between an outer surface of the inner gradient coil winding and an inner surface of the outer gradient coil winding; and, a filler material, substantially filling the hollow annular space, comprising concrete, wherein the concrete comprises portland cement and a selected aggregate material, wherein the aggregate material comprises pumice and the concrete has a specific gravity of approximately 1.68.

2. A self-shielded gradient coil assembly, comprising:

inner and outer gradient coil windings, each of a hollow cylindrical configuration and of respectively smaller and larger inner and outer diameters, disposed in coaxial relationship and defining a hollow annular space between an outer surface of the inner gradient coil winding and an inner surface of the outer gradient coil winding; and, a filler material, substantially filling the hollow annular space, comprising concrete, wherein the concrete comprises portland cement and a selected aggregate material, wherein the aggregate material comprises a mixture of pumice and latex.

3. A self-shielded gradient coil assembly as recited in claim 2, wherein the latex comprises a water-latex solution.

4. A self-shielded gradient coil assembly as recited in claim 2, wherein the concrete has a specific gravity of approximately 1.82.

5. A self-shielded gradient coil assembly, comprising:

inner and outer gradient coil windings, each of a hollow cylindrical configuration and of respectively smaller and larger inner and outer diameters, disposed in coaxial relationship and defining a hollow annular space between an outer surface of the inner gradient coil winding and an inner surface of the outer gradient coil winding; and, a filler material, substantially filling the hollow annular space, comprising concrete, wherein the concrete comprises portland cement and a selected aggregate material and wherein the aggregate material is selected from a group consisting of pumice, fly ash and expanded shale materials, and wherein the concrete has been treated with supercritical $CO_2$ while hardening.

6. A self-shielded gradient coil assembly, comprising:

inner and outer gradient coil windings, each of a hollow cylindrical configuration and of respectively smaller and larger inner and outer diameters, disposed in coaxial relationship and defining a hollow annular space between an outer surface of the inner gradient coil winding and an inner surface of the outer gradient coil winding; and, a filler material, substantially filling the hollow annular space, comprising concrete, wherein the concrete comprises standard cement having a specific gravity of approximately 2.27 and a selected aggregate material and wherein the aggregate material is selected from a group consisting of pumice, fly ash and expanded shale materials.

* * * * *